(12) United States Patent
Novak et al.

(10) Patent No.: US 6,515,381 B1
(45) Date of Patent: Feb. 4, 2003

(54) CANTILEVER STAGE

(75) Inventors: W. Thomas Novak, Hillsborough, CA (US); Michael Kovalerchik, Castro Valley, CA (US)

(73) Assignee: Nikon Corporation, Tokyo (JP)

(*) Notice: Subject to any disclaimer, the term of this patent is extended or adjusted under 35 U.S.C. 154(b) by 18 days.

(21) Appl. No.: 09/661,321

(22) Filed: Sep. 13, 2000

(51) Int. Cl.⁷ .......................... G03B 27/42; H02K 41/00
(52) U.S. Cl. ............................................. 310/12; 355/53
(58) Field of Search .............................. 310/12; 29/721, 29/760, 785; 33/1 M; 74/471 XY, 479.01; 355/53

(56) References Cited

U.S. PATENT DOCUMENTS

| | | | |
|---|---|---|---|
| 5,036,715 A | 8/1991 | Hanson | 73/862.59 |
| 5,066,358 A | 11/1991 | Quate et al. | 216/2 |
| 5,150,392 A | 9/1992 | Hohn et al. | 378/34 |
| 5,153,494 A | * 10/1992 | Hollis, Jr. | 318/640 |
| 5,537,863 A | 7/1996 | Fujiu et al. | 73/105 |
| 5,623,853 A | 4/1997 | Novak et al. | 74/490.09 |
| 5,717,132 A | 2/1998 | Watanabe et al. | 73/105 |
| 5,723,775 A | 3/1998 | Watanabe et al. | 73/105 |
| 5,751,585 A | * 5/1998 | Cutler et al. | 364/474.03 |
| 5,770,899 A | 6/1998 | Hayashi | 310/12 |
| 6,028,376 A | * 2/2000 | Osanai et al. | 310/12 |

OTHER PUBLICATIONS

"Linear Brushless DC Motor," author unknown, IBM Technical Disclosure Bulletin vol. 27, issue 1A, Jun. 1984, pp 50–54.*

* cited by examiner

Primary Examiner—Nestor Ramirez
Assistant Examiner—Judson Jones
(74) Attorney, Agent, or Firm—Finnegan, Henderson, Farabow, Garrett & Dunner, L.L.P.

(57) ABSTRACT

A cantilever stage for precision movement and positioning an article such as a reticle in an electron beam photolithography system is disclosed. The cantilever stage comprises a cantilevered support platform for supporting the article extending from a movable member. The cantilever stage is supported by at least one elongate guide extending through a channel defined by the movable member. The cantilever stage may be driven by one or more actuators mechanically coupled to the movable member to move and position the cantilever stage in a first direction along the elongate guide. The actuator may be any suitable actuator such as an electromagnetic drive motors. The movable portion defines an open region which includes the center of gravity of the cantilever stage and is configured to receive a counterbalance or reaction force balancing device. The cantilever stage may also be driven in a second direction, generally perpendicular to the first direction, by an actuator mechanically coupled to the elongate guide.

22 Claims, 8 Drawing Sheets

CANTILEVER STAGE

BACKGROUND OF THE INVENTION

1. Field of Invention

The present invention relates to a stage for supporting, moving and positioning articles in an X-Y plane in a limited space. More particularly, the present invention relates to a cantilever stage for supporting, moving and positioning articles in an X-Y plane in a limited space such as for image-forming equipment used in manufacturing reticles, semiconductor devices and liquid crystal displays (LCD).

2. Description of the Related Art

Many devices such as reticles, semiconductor circuits and liquid crystal displays are fabricated using lithographic equipment, such as an electron beam lithography system. In the fabrication of circuits and/or liquid crystal displays, a substrate must be repeatedly and precisely positioned under the optics of a lithographic system. Such precise positioning is necessary to ensure accurate alignment of the microscopic features being formed in a new layer with other microscopic features previously formed in the layers previously formed on the substrate during the fabrication process for semiconductor circuits or liquid crystal displays.

Complex systems have been developed to precisely position an article, such as positioning a substrate or a reticle beneath the lithographic optics. A step and repeat system often uses an X-Y positioning system to position the substrate on a positioning stage beneath the lithographic equipment, expose a portion of the substrate to a pattern of light or charged particles generated by the lithographic equipment, and reposition the substrate or reticle at another location to again expose the substrate or reticle to the pattern of light or charged particles.

Many different types of positioning stage and linear motors that move the positioning stage into the desired position, such as beneath the lithographic equipment, have been developed in an attempt to provide improved accuracy of article placement. The articles being worked upon are typically supported and positioned using X-Y guides. Typically, such X-Y guides include a separate X guide assembly and a Y guide assembly, with one guide assembly mounted on and movable with the other guide assembly. Often a separate wafer stage is mounted on top of the guide assemblies. These structures comprise many components and are typically used in a wafer stepper apparatus where the alignment of an exposure field to the reticle being imaged affects the success of the circuit, i.e., the yield.

However, convention positioning stages does not provide for the moving and positioning of an article in limited space. For example, in fabricating reticles, the reticles must be carried through a narrow gap of an electron beam lithography system. Thus, conventional positioning stages cannot be used to move and position reticles in an electron beam lithography system. In addition, conventional positioning stages require additional space for counterbalance mechanism which further limits their use in limited space applications. Further, conventional positioning stages often do not shield the magnetic fields created by the moving motors from the electron beam lithography system. The magnetic fields can adversely affect the electron beam and thereby decrease the yield.

SUMMARY OF THE INVENTION

This present invention comprises a cantilever stage to support and accurately move and position articles, such as a reticle or wafer in an electron beam photolithography system. The cantilever stage generally comprises a movable member and a cantilevered support platform extending from the movable member for supporting articles to be positioned. The cantilever stage is preferably supported by and movable in an X direction along two parallel elongate guides extending through two parallel channels defined by the movable member. The two parallel elongate guides are in turn supported by a main frame.

The cantilever stage is preferably driven by two linear motors or actuators mechanically coupled to the movable member to move and position the cantilever stage in the X direction along the elongate guides. The actuators may be any suitable actuators such as electromagnetic drive motors comprising magnet tracks mounted on the main frame and cooperating with armature or coils fixed to the movable member of the cantilever stage. The coils are movable relative to the magnet tracks in the X direction upon application of an appropriate current.

Where the cantilever stage is operated at high speeds and/or high accelerations, a mechanism to cancel the reaction forces is preferably provided. Such cancellation mechanism may be achieved by providing any suitable counterbalance or reaction force cancellation device in the center of gravity or center of mass of the cantilever stage. The counterbalance device generally comprises counterbalancing mass and a linear motor disposed within a housing.

The counterbalance device is preferably provided at the center of gravity of the cantilever stage. The movable portion may define a space or region which includes the center of gravity of the cantilever stage in which the counterbalance device may be disposed. The mass of the counterbalance device counterbalancing mass is preferably approximately equal to the mass of the stage and the armature of the linear motors and may be adjustable in order to account for variances in the mass of the articles supported by the supporting platform.

Bearings such as air bearings may be provided to facilitate the movement of the cantilever stage along the elongate guides. In addition, bearings may also be provided to facilitate the movement of the counterbalancing mass relative to the remainder of the counterbalance device.

The cantilever stage may also be driven in a Y direction relative to the main frame, generally perpendicular to the X direction, by one or more actuators mechanically coupled to the elongate guides. Similar to the actuators for the X direction, the Y direction actuators may also be any suitable linear actuator. Alternatively, the cantilever stage may be driven in the Y direction by moving the main frame in the Y direction such as by actuating one or more actuators mechanically coupled to the main frame.

The cantilever positioning stage of the present invention provides a simple, effective and space-efficient method to control and align articles to be supported, moved and positioned by providing a cantilevered support platform and/or by allowing for the provision of a counterbalance device at the center of gravity of the cantilever positioning stage.

Although the present invention is described in terms moving and positioning reticles in an electron beam lithography system, the present invention can be used in any automated transport application.

DESCRIPTION OF THE PREFERRED EMBODIMENTS

The present invention comprises a cantilever stage which generally comprises a movable member and a cantilevered support platform extending from the movable member for supporting articles to be positioned. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Cantilever Stage

Figure 1A:
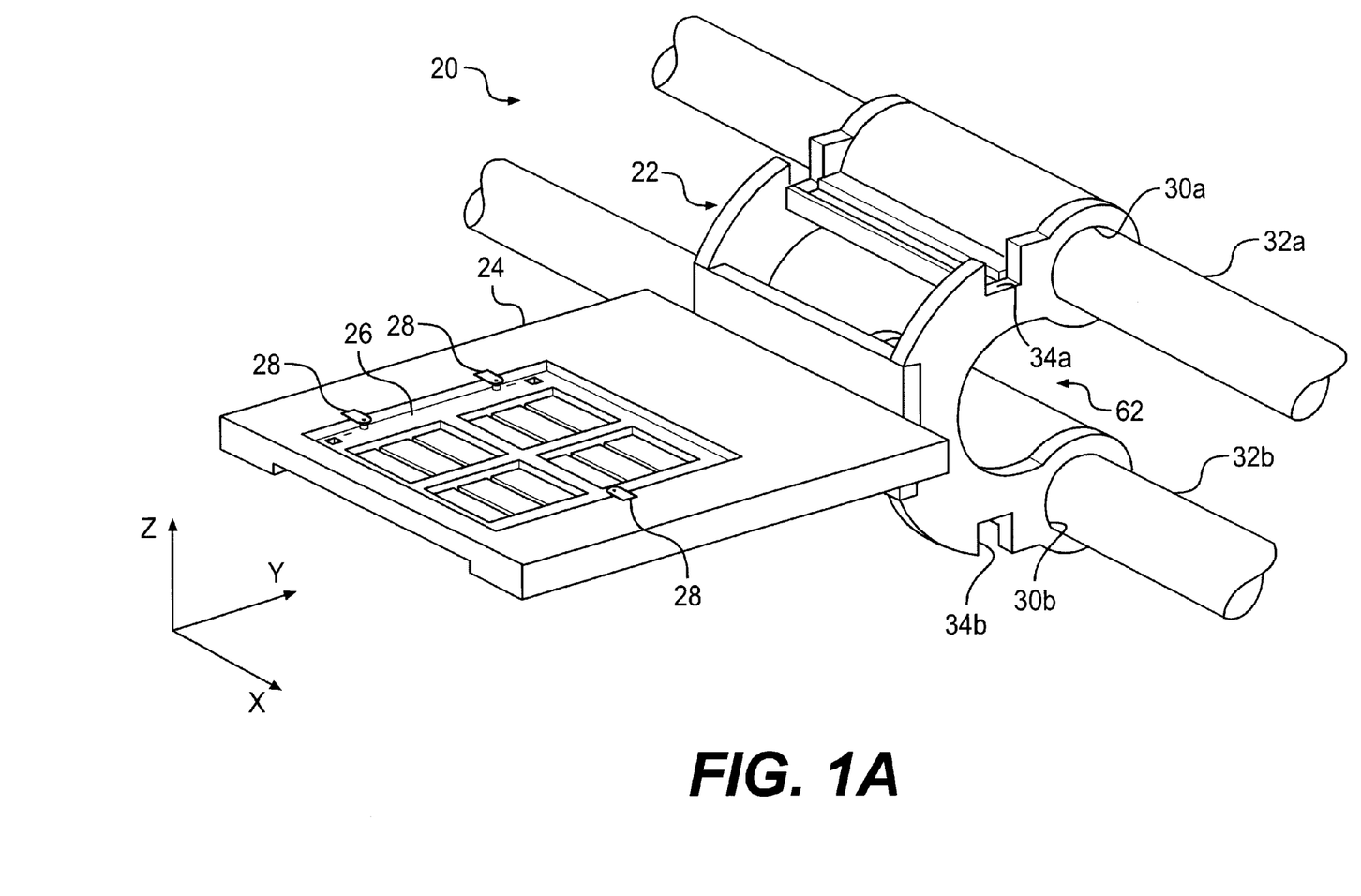
FIG. 1A shows a perspective view of a cantilever positioning stage of the present invention supported by elongate guides.
Figure 1B:
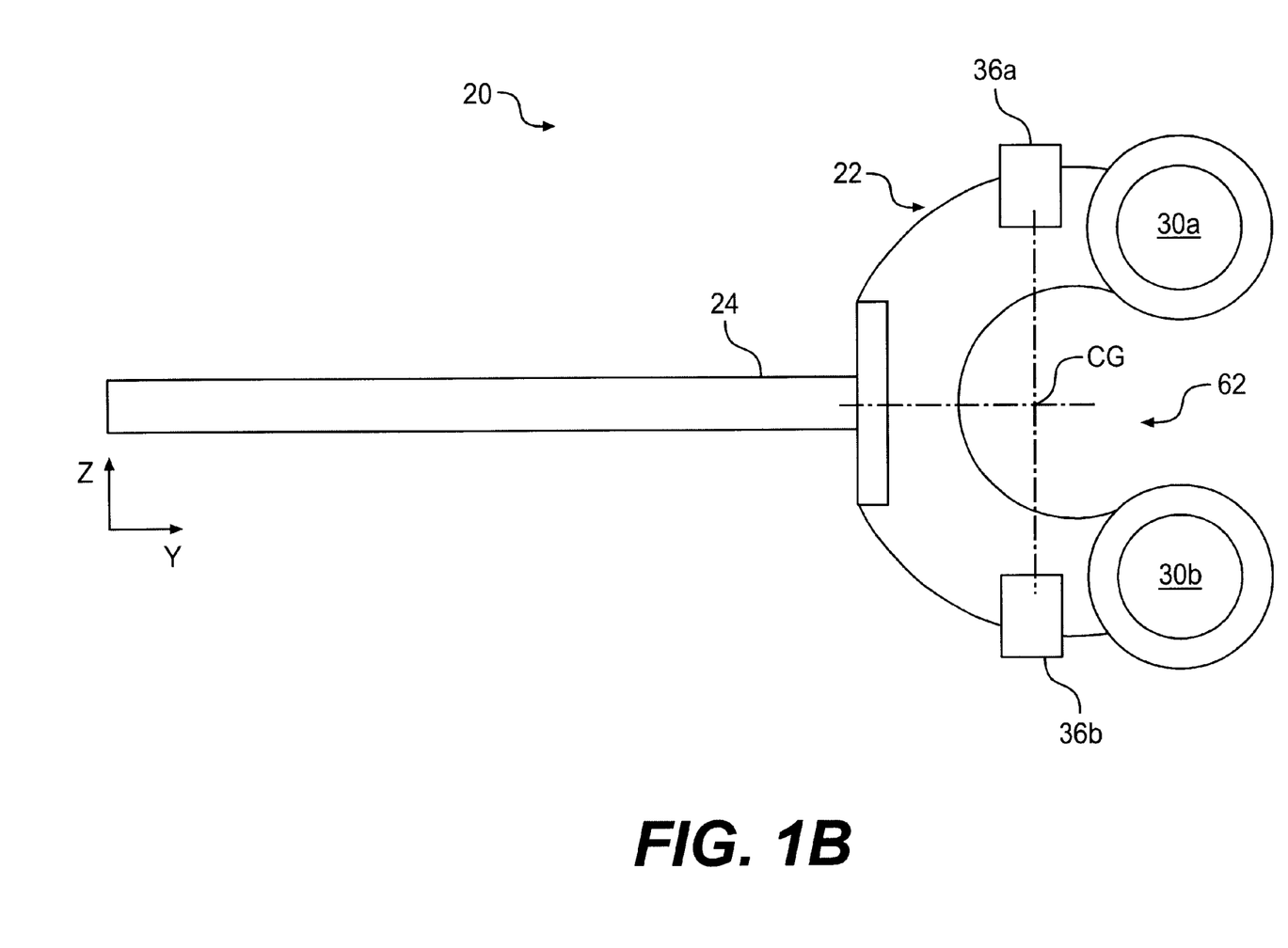
FIG. 1B shows a plan side view of the cantilever positioning stage of FIG. 1 without the elongate guides and with the linear motors.

Referring to the illustrative drawings of FIGS. 1A and 1B, there is shown a presently preferred first embodiment of a cantilever stage 20 in accordance with the invention. The cantilever stage 20 generally comprises a movable member 22 and a cantilevered support platform 24 extending from the movable member for supporting one or more articles 26 to be supported, moved and positioned. The articles 26 may be secured to the platform 24 by clamps 28 and/or by any suitable securing mechanisms. The dimensions of the cantilever stage 20 are scalable to those desired, depending upon the specific application. For example, where the cantilever stage of the present invention is utilized for supporting, moving and positioning reticles in an electron beam photolithography system, the cantilevered support platform 24 may be approximately 450 mm by 450 mm by 50 mm and the movable member 22 may be approximately 300 mm by 200 mm by 5 mm.

The movable member 22 defines two generally parallel open-ended channels 30a, 30b extending in the X direction. Two generally parallel elongate linear stationary guides 32a, 32b extend through channels 30a, 30b to support the cantilever stage 20 and such that cantilever stage 20 is movable or slidable relative to the guides 32a, 32b. Although the channels 30a, 30b and the elongate guides 32a, 32b are shown to have circular cross-sectional shape, the channels and the guides may have any cross-sectional shape(s) such as elliptical, rectangular and/or square.

Alternatively, although not preferred or shown, the cantilever stage may define only one channel. In such an alternative, it may be preferable to provide a channel having a non-circular cross-section to minimize the rotation of the cantilever stage about the X axis. For example, the single channel may have a rectangular, elliptical, or any other suitable cross-sectional shape. Accordingly, the corresponding linear guides would have a similar cross-sectional shape. In another alternative, the cantilever stage may define three or more generally parallel open-ended channels. This alternative is also not preferred as such channels would occupy additional space and thereby increase the volume of the cantilever stage.

Bearings may be provided to facilitate the movement of the cantilever stage 20 along the elongate guides 32a, 32b by reducing the friction between the elongate guides 32a, 32b and the channels 30a, 30b and by providing for smoother movement of the cantilever stage 20 relative to the elongate guides 32a, 32b. For example, bearings may be provided on the elongate guides and/or on an interior surface of each of the channels 30a, 30b. Any suitable bearings may be utilized and include mechanical bearings such as solid roller, needle, ball and/or air or gas bearings. Air or gas bearings support the mass of the cantilever stage 20 by pressurized of air, nitrogen, or other gas. In the case of air or gas bearings, hoses (not shown) deliver air or gas from an air or gas source to interior of the channels 30a, 30b via ports (not shown) provided by the channels 30a, 30b. The air or gas thus provides an air cushion between channel 30a and elongate guide 32a and between channel 30b and elongate guide 32b.

Cantilever Stage System

Figure 2A:
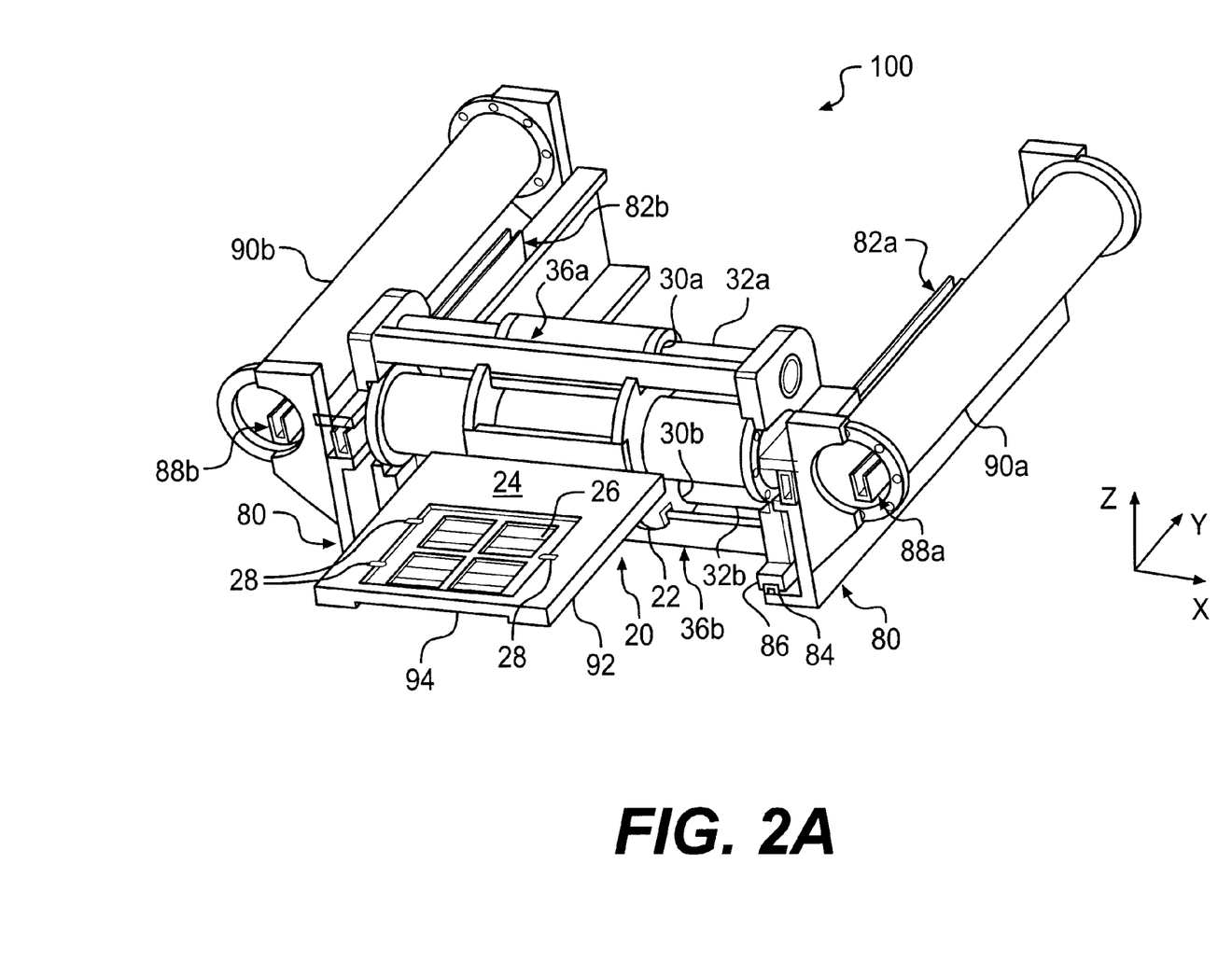
FIG. 2A shows a perspective view of the cantilever positioning stage of FIG. 1 attached to a main frame having counterweight devices and linear motors attached thereto.
Figure 2B:
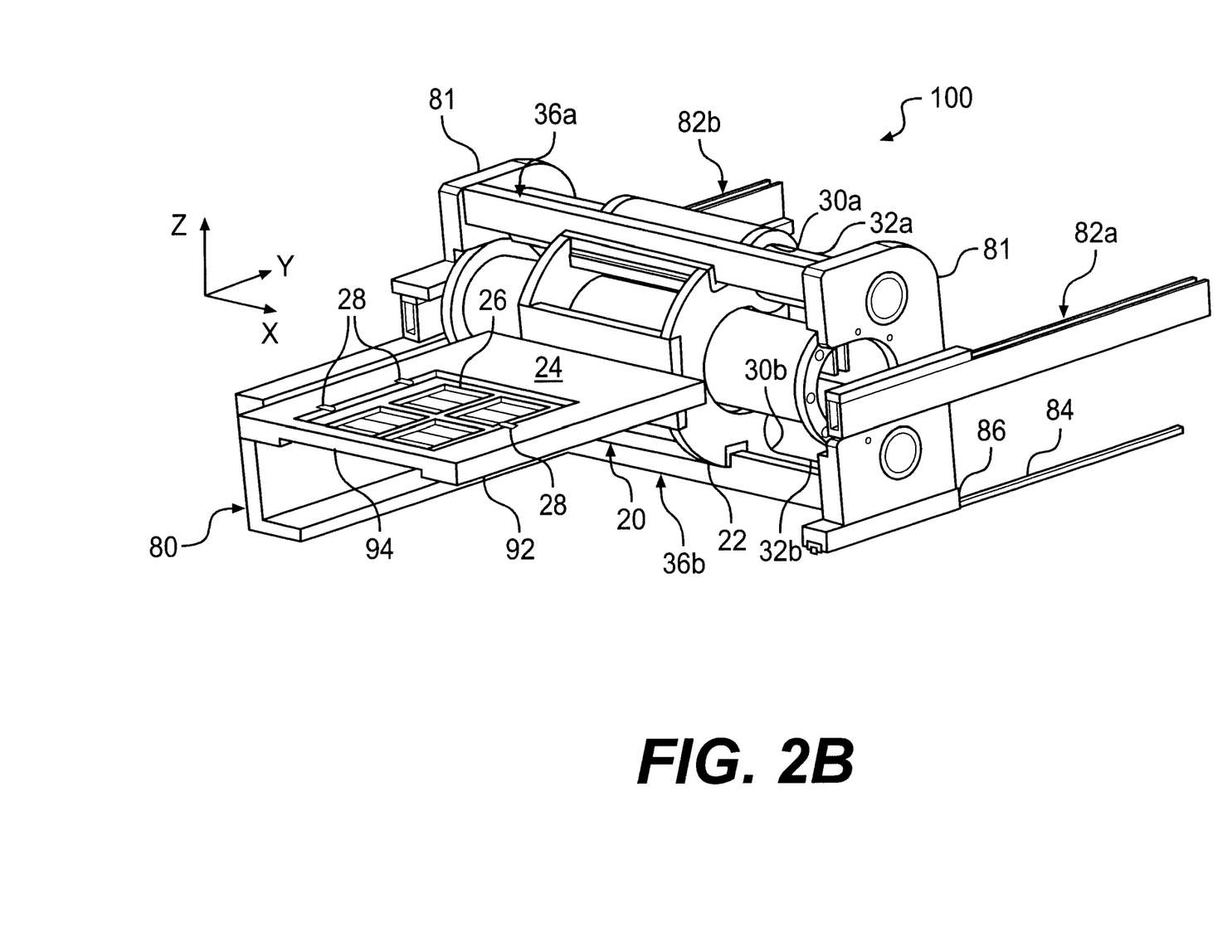
FIG. 2B shows a partial perspective view of the cantilever positioning stage and main frame of FIG. 2A.

A perspective view of a cantilever stage system 100 comprising the cantilever stage 20 is shown in FIG. 2A. FIG. 2B shows a partial perspective view of the cantilever stage system 100 of FIG. 2A without certain components for purposes of clarity. The cantilever stage system 100 stationary main frame 80 is provided to support 81. Supports 81 are stationary in the X direction while movable in a Y direction relative to the main frame 80. Each of supports 81 is affixed to a guide 86 slidable along in a Y direction on a track 84 affixed to the main frame 80 to facilitate movement of the supports 81 in the Y direction relative to the main frame 80.

The linear guides 32a, 32b which support the cantilever stage 20 extend to and are affixed to and supported by supports 81. Two linear motors 36a, 36b may be provided to generate a force and to provide motion of the cantilever stage 20 along the linear guides 32a, 32b in the X direction relative to the guides 81. Preferably, each of the motors 36a, 36b comprises a movable portion affixed to the movable member 22 of the cantilever stage 20 and a stationary portion affixed to the guides 81. For example, the stationary portion of each of the motors 36a, 36b may be a magnet track having ends which extend to and are affixed to the supports 81. In addition, the movable portion of each of the motors 36a, 36b may be an armature having a width approximately equal to the width of the movable member 22 and affixed within slots 34a, 34b defined by the movable member 22 of the cantilever stage 20. Alternatively or additionally, motors 36a, 36b may be secured to movable member 22 by bolts, adhesives, or any other suitable fastening mechanisms or devices.

Upon actuation, the X direction linear motors 36a, 36b exert forces on the cantilever stage 20 in the X direction such that the cantilever stage 20 moves in the X direction along the linear guides 32a, 32b relative to the stationary guides 32a, 32b.

As described, supports 81 are stationary in the X direction while movable in a Y direction relative to the main frame 80. Two Y direction linear motors 82a, 82b may be provided to generate forces for moving the assembly of the supports 81, the cantilever stage 20, the X direction motors 36a, 36b and the linear guides 32a, 32b in the Y direction relative to the main frame 80, the Y direction being generally perpendicular to the X direction. Similar to the X direction motors 36a, 36b, each of the Y direction motors 82a, 82b preferably comprises a movable portion and a stationary portion. For example, the movable portion may be an armature affixed to the supports 81 and the stationary portion may be a magnet track affixed to main frame 80.

The Y direction motors 82a, 82b operate independently of the X direction motors 36a, 36b. Upon actuation of the Y direction motors 82a, 82b, the movable portion and the stationary portion of the Y direction motors 82a, 82b exert forces upon each other to cause the assembly of the supports 81, cantilever stage 20, the X direction motors 36a, 36b and the linear guides 32a, 32b to move relative in the Y direction to the main frame 80.

The linear motors 36a, 36b, 82a, 82b may be any combination of suitable motors such as electromagnetic drive motors which include magnet tracks and cooperating with armature or coils movable relative to the magnet tracks upon application of an appropriate current. With respect to the X direction linear motors 36a, 36b, the magnet track is preferably mounted to the support 81 which is fixed in the X direction relative to the cantilever stage while the armature is mounted to the cantilever stage and movable relative to the magnet tracks. With respect to the Y direction linear motors 82a, 82b, the magnet track is preferably mounted to the fixed frame 80 to which the fixed track 84 is mounted while the armature is preferably mounted to the support 81 and movable relative to the fixed frame and the track 84.

As is evident, the above examples are merely illustrative and many other types and configurations of linear motors may be utilized in the cantilever stage of the present invention.

The provision of two generally parallel X direction linear motors 36a, 36b facilitates in reducing or preventing vibration of the cantilever stage 20 as well as in reducing or preventing the creation of a moment about the axis (X) of the linear motors 36a, 36b. Similarly, the provision two generally parallel Y direction linear motors 82a, 82b facilitates in reducing or preventing vibration of the cantilever stage 20 as well as in reducing or preventing the creation of a moment about the axis (Y) of the linear motors 82a, 82b.

The Y direction linear motors 82a and 82b may be differentially driven to prevent and overcome any tendency of the support platform 24 to yaw, i.e. rotate about the vertical Z axis. Similarly, the X direction linear motors 36a and 36b may be differentially driven to prevent and overcome any tendency of the support platform 24 to pitch, i.e. rotate about the horizontal Y axis. The support platform 24 may tend to pivot, i.e. move faster on one side versus the other, as each pair of linear motors 36a and 36b, 82a and 82b may drive the support platform 24 at different speeds relative to each other.

Various devices may be utilized to measure and determine the orientation and position of the support platform 24 in order to determine the appropriate currents to apply to the linear motors 36a, 36b, 82a, 82b. For example, an interferometer (not shown) may be provided which utilizes signals reflected from mirrors provided on faces 92, 94 of the support platform 24 to measure and determine the orientation and position of the support platform 24. A controller may be provided to determine and apply different levels of current to the coils of each linear motors 36a, 36b, 82a, 82b in response to signals indicative of the position and orientation of the support platform 24, such as the signal output of an interferometer.

In addition, the air-bearing structure associated with support platform 24 may also provide some anti-yaw effect. The differential drive provides higher anti-yaw performance than the air bearings alone. Thus, any tendency of support platform 24 to yaw is minimized by the differential drive control.

Provision of Counterbalance Devices

One or more counterbalance devices may be provided to facilitate the cancellation of reaction forces exerted on the main frame 80 by the cantilever stage 20 when the cantilever stage 20 is subjected to high accelerations in the X and/or Y directions by the X direction motors 36a, 36b and/or the Y direction motors 82a, 82b. However, if the cantilever stage 20 is utilized at relatively low accelerations, the provision of a counterbalance device may be unnecessary.

Where a counterbalance device is provided for the cancellation of forces in the X direction, the X direction counterbalance device is preferably disposed at a location coinciding with the center of gravity of the cantilever stage 20. Preferably, the cantilever stage 20 defines a space or region 62 (shown in FIG. 1A) which includes the center of gravity of the cantilever stage 20 in which a counterbalance device may 10 be disposed. The center of gravity of the cantilever stage 20 is indicated as CG (shown in FIG. 1B) located at approximately the intersection of the two dash-dot lines designating the center of gravity in the Y and Z directions, respectively. The region 62 may be partially enclosed or otherwise configured to receive a counterbalance device (not shown) therein such that the counterbalance device attached to the main frame 80 is disposed at a location including the center of gravity CG of the cantilever stage 20. In addition, a volume of clearance is provided between the X direction counterbalance device and the portion of the movable member 22 defining region 62 such that the counterbalance device does not contact the movable member 22 nor any other portion of the cantilever stage 20.

Where a counterbalance device is provided for the cancellation of forces in the Y direction, two Y direction counterbalance devices are preferably disposed along the Y direction adjacent the supports 81. As shown in FIG. 2A, Y direction counterbalance devices 88a, 88b for the cancellation of reaction forces resulting from forces generated by the Y direction motors 82a, 82b may be disposed within sleeves 90a, 90b. The sleeves 90a, 90b are fixed to or integral with main frame 80 and are preferably generally parallel and extending in the Y direction.

The cantilever stage system 100, including the cantilever stage 20, the main frame 80, the linear motors 36a, 36b, 82a, 82b, as well as the X force counterbalancing device, and the Y force counterbalancing devices 88a, 88b, may comprise any suitable material such as steel, aluminum, ceramics, plastics, depending upon factors such as the requirements of the specific application, weight, and cost. For electron beam lithography applications, components of the cantilever stage system 100 preferably comprises non-metallic materials such as ceramics and plastics in order to prevent the moving parts from interfering and adversely affecting the electron beam.

Linear Motors

Figure 3:
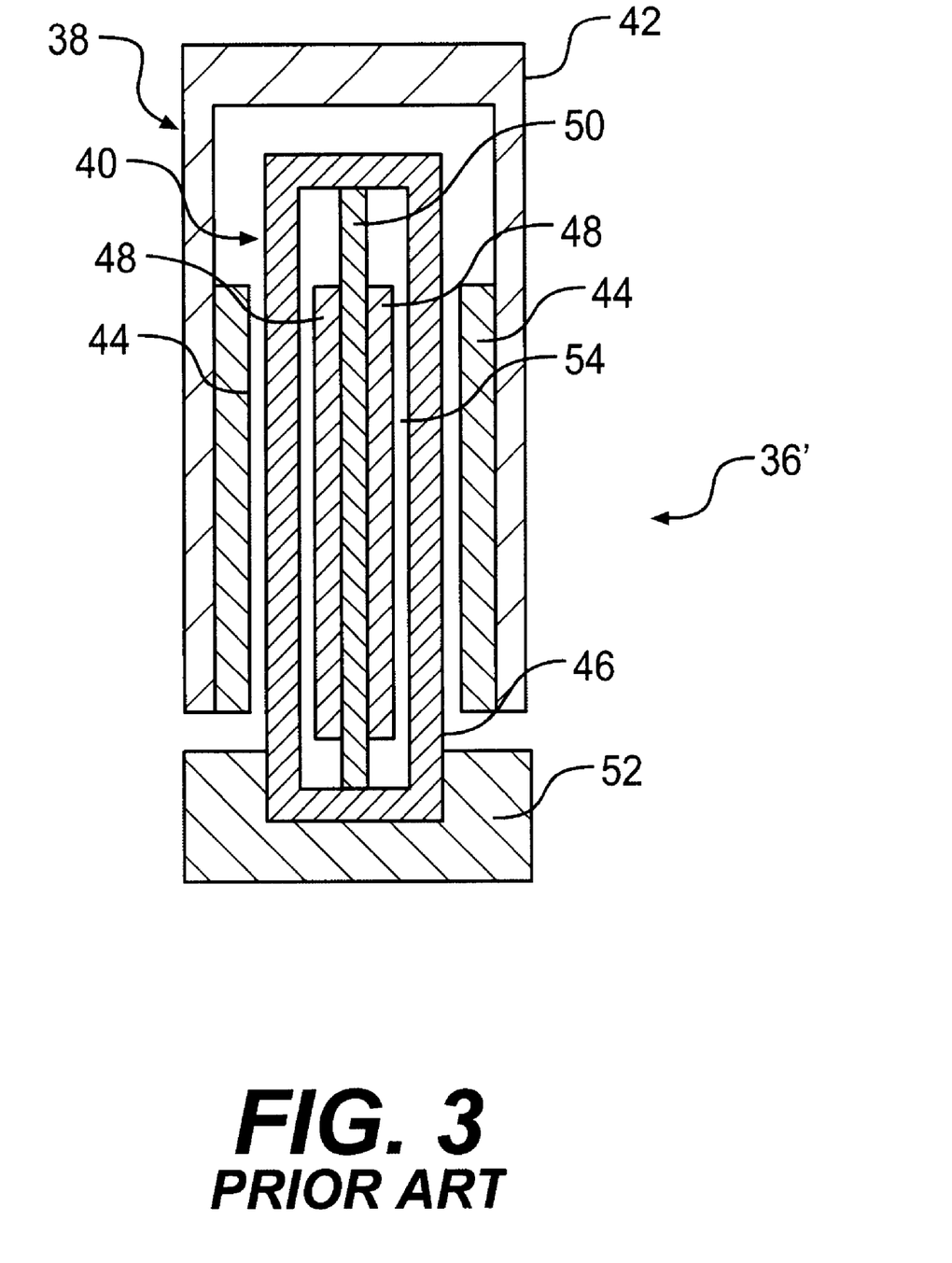
FIG. 3 shows a cross-sectional view of an example of a linear motor for use in the cantilever positioning stage of the present invention.

A cross-sectional view of an example of a linear motor for use with the cantilever stage of the present invention is shown in FIG. 3. The linear motor 36' comprises a stationary magnet track 38 and an armature 40 disposed within and movable along the magnet track 38. The armature 40 may be attached to the cantilever stage, such as within the slots 34a, 34b defined by the moving member (as shown in FIGS. 1A and 1B).

The magnet track 38 comprises a magnet holding member 42 having pairs of opposing magnets 44 facing each other and secured on inside portions of the magnet holding member 42. The armature 40 disposed within the magnet track 38 comprises a container 46 for enclosing a coil 48 held by a coil holding plate 50. The coil holding plate 50 and the coil container 46 are secured to a supporting base 52. Spaces provided between coil container 46 and the two opposing magnets 44 of each magnet pair allow the armature 40 to move between pairs of opposing magnets 44.

The coil 48 has windings of a conductor. When an electrical current is applied to the windings of the coil, forces proportional to a product of the current and a local magnetic field are generated to cause the magnet track 38 and the armature 40 to move relative to each other. When the armature 40 is attached to the cantilever stage, the cantilever stage moves and positions in concert with the armature 40 as the magnet track 38 and the armature 40 move relative to each other. Alternatively, the magnet track 38 may be attached to the cantilever stage such that the cantilever stage moves in concert with the magnet track 38.

Air or a cooling fluid may be introduced into and circulated through a passageway 54 in the coil container 46 to absorb the heat generated by the coil 48.

Figure 4:
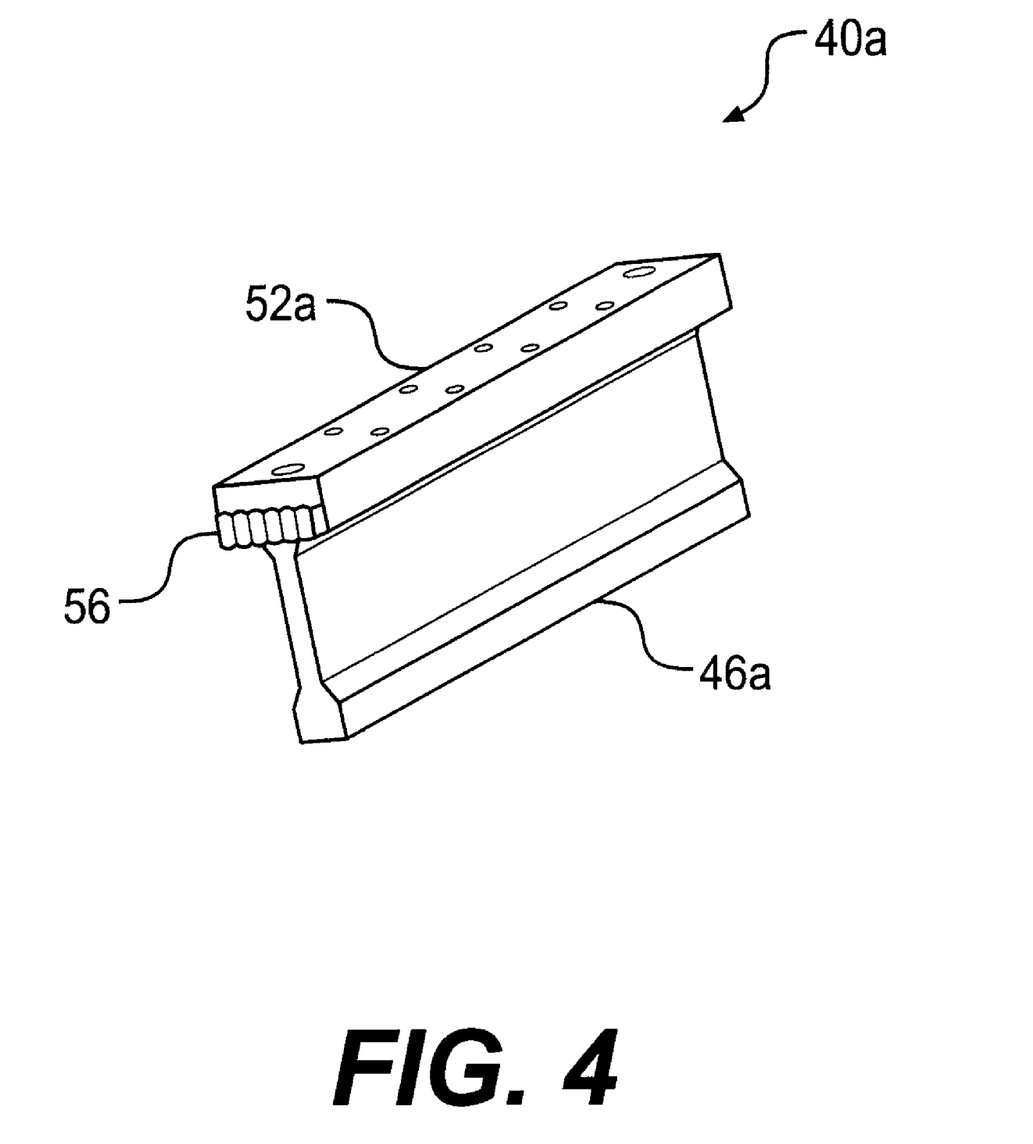
FIG. 4 shows a perspective view of an armature of another example of a linear motor for use in the cantilever positioning stage of the present invention.
Figure 5:
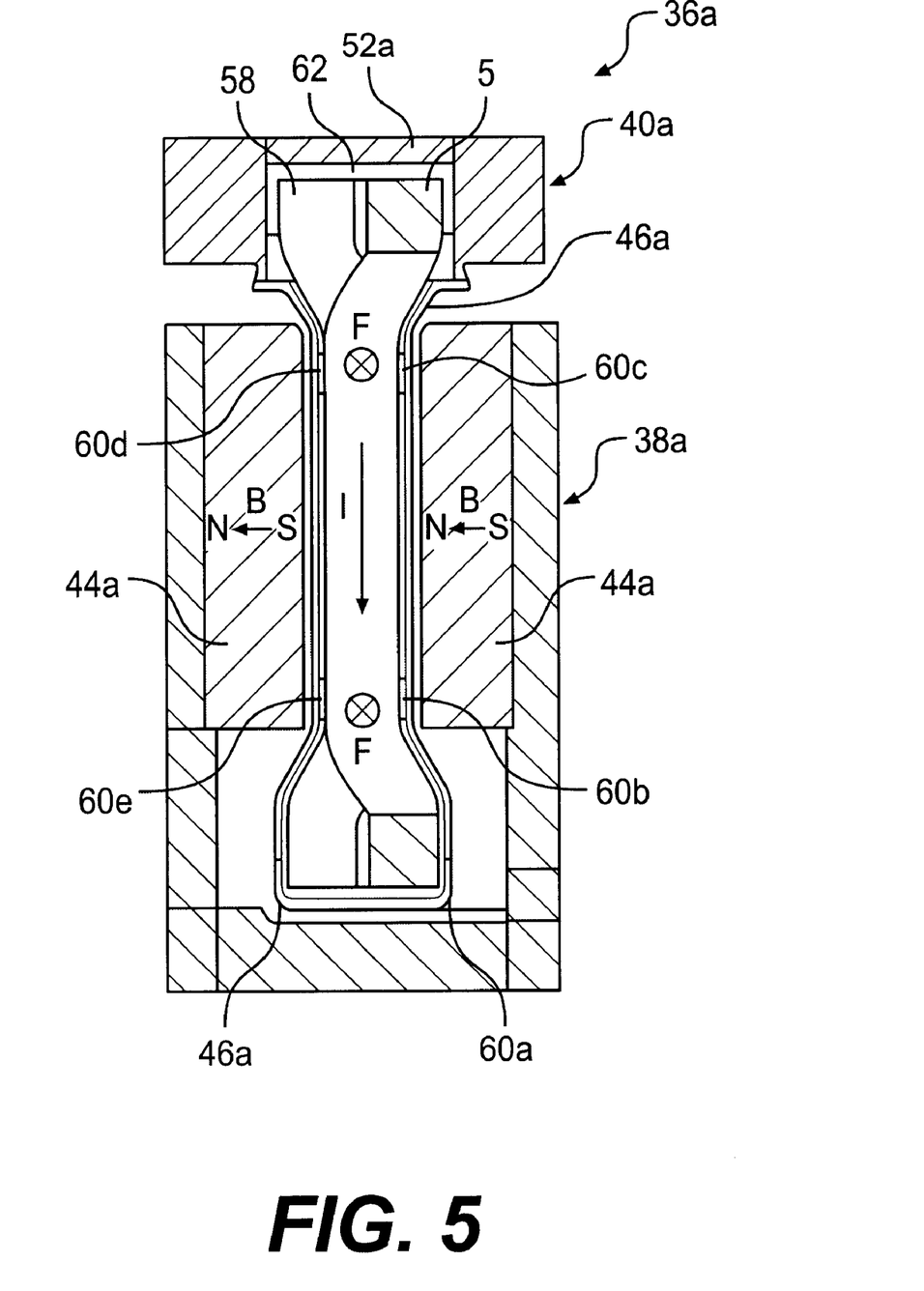
FIG. 5 shows a cross-sectional view of the linear motor including the armature of FIG. 3 inserted into a magnet track.

Another example of a linear motor for use with the cantilever stage of the present invention is shown in FIGS. 4 and 5, as described in copending U.S. application Ser. No. 09/054,766, filed Apr. 3, 1998 the entirety of which is incorporated herein by reference. FIG. 4 shows a perspective view of an armature 40A of the linear motor 36A and FIG. 5 shows a cross-sectional view of the linear motor 36A illustrating the armature 40A inserted into and movable relative to a magnet track 38A.

The armature 40A of the linear motor 36A comprises regular windings 58 disposed inside the enclosure 46A. The enclosure 46A may have a gap between itself and the regular windings inside the armature 40A to permit a coolant to flow over the windings inside the armature 40A. The enclosure 46A is attached to a header or support base 52A such as by welding or any other suitable attachment mechanism or device. A terminal 56 is also attached to the support base 52A and electrically connected to the regular windings. The regular conductor windings 58 may be attached to the header or support base 52A by an adhesive substance 62, such as an epoxy or any other glues or adhesives. The adhesive substance 62 may also thermally insulate the regular conductor windings 58 from the support base 52A.

The armature 40A of the linear motor 36A is inserted into and movable relative to a magnet track 38A. The enclosure 46A is spaced from the regular windings 58 by thermal insulators 60a, 60b, 60c and 60e to prevent heat transfer between the regular windings 58 and the enclosure 46A. The space between the regular windings 58 and the enclosure 46A also allows a coolant to flow inside the enclosure 46A and about the regular windings 58. Thermal insulation is desirable to prevent heat transfer to other parts of the linear motor 36A and other equipment in proximity to the armature 40A.

The magnet track 38A has pairs of magnets 44A periodically spaced along the track. Each magnet in each pair 44A faces the other magnet in the pair 44A to align their respective magnetic fields and form a space between the magnets. The armature 40A is shaped to move between the spaces formed by each pair of magnets 44A. The armature 40A has regular conductor windings 58 each of which has approximately the same shape. The regular conductor windings 58 are arranged in overlapping fashion to essentially maximize a conductor density within the spaces between the magnet pairs 44A when the regular conductor windings 58 are within the spaces. When electrical current is applied to the regular conductor windings 58, the regular conductor windings 58 emit electromagnetic fields that interact with magnetic fields of the magnet pairs 44A to exert a force on the armature 40A causing the armature 40A to move relative to the magnet track 38A.

In addition, bearings may be provided between the magnet track and the armature of the linear motors to reduce friction and to guide the movement of the armature in the magnet track for smoother movement. The bearings may be any suitable bearings suitable for use between the channel and the elongate guide, as described above. Bearing may further be provided in the counterbalance device to similarly reduce friction and to guide the movement of the counterbalancing mass within the counterbalance device for smoother movement.

Counterbalance Device

Figure 6A:
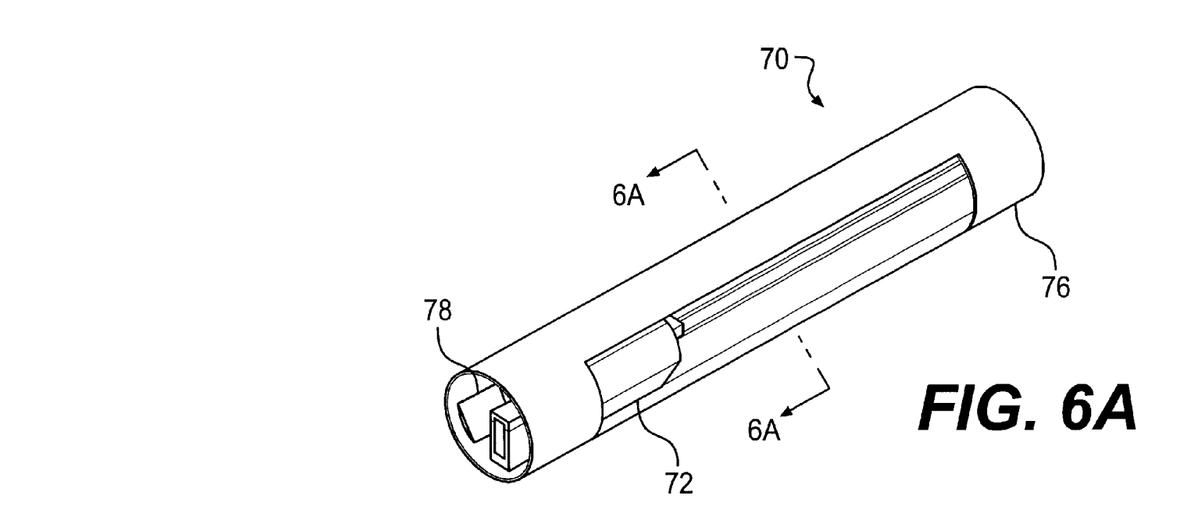
FIG. 6A shows a partial cut-away perspective view of an example of a counterbalance device suitable for use in the cantilever stage of the present invention and suitable for placement in the region of the movable member.
Figure 6B:
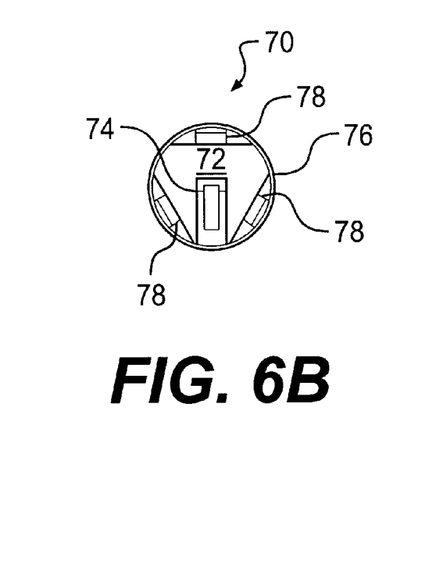
FIG. 6B shows a cross-sectional view along line 6A—6A of the counterbalance device of FIG. 6A.
Figure 6C:
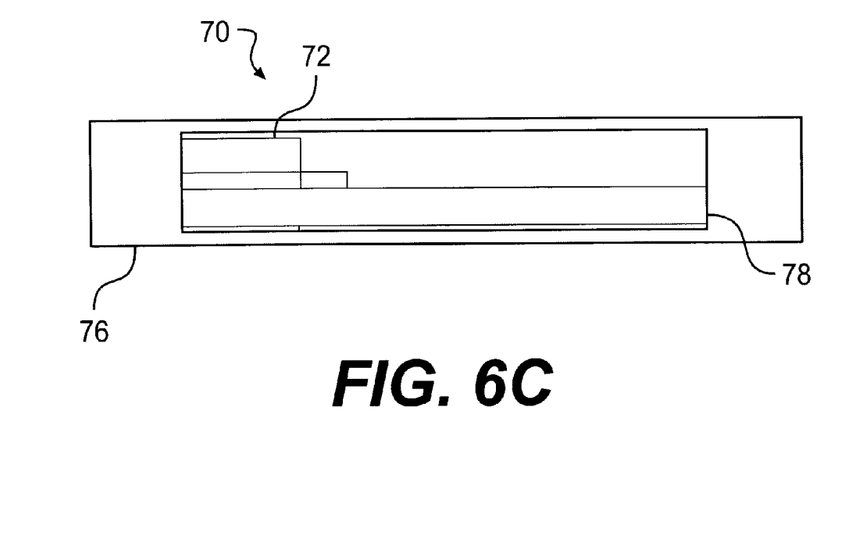
FIG. 6C shows a cut-away side view of the counterbalance device of FIGS. 6A and 6B.

FIGS. 6A–C show, respectively, a partial cut-away perspective view, a cross-sectional view along line 6A—6A of FIG. 6A and a cut-away side view of an example of a counterbalance device 70 suitable for use in the cantilever stage system 100 of the present invention, as described in co-pending U.S. patent application Ser. No. 09/661,312 entitled "Mechanism for Cancellation of Reaction Forces in X-Y Stages" the entirety of which is incorporated herein by reference. The counterbalance device 70 may be utilized as the X direction counterbalance device placed within the region 62 of the movable member 22 and/or as the Y direction counterbalance devices placed within sleeves 90a, 90b.

The counterbalance device 70 generally comprises a counterbalancing mass 72 and a linear motor 74 disposed within a housing 76. In addition, one or more bearings 78 may be provided within housing 76 to facilitate the movement of the counterbalancing mass 72 and the linear motor 74 within housing 76. The bearings 78 may be attached to an interior surface of the housing 76 or to the surfaces of the counterbalancing mass 72 to support the counterbalancing mass 72. Again, the bearings may be any suitable bearings suitable for use for linear motors or for use between the channel and the elongate guide, as described above.

The housing 76 may be enclosed along the its length or along the path of travel of the counterbalancing mass 72 to shield the counterbalancing mass 72 from magnetic fields generated by the magnets and coils of the linear motors. The housing 76 may also be enclosed to prevent gas leakage into the vacuum environment if the invention is used in a vacuum system. However, the housing 76 may be open on both ends to allow the gas in the housing 76 to escape through the open ends as the counterbalancing mass 72 moves along the length of the housing 76. Alternatively, the housing 76 may be mostly enclosed and provided with openings sized and positioned to allow a desired amount of resistance or damping of movement of the counterbalancing mass 72 and the linear motor 74 within the housing 76.

The housing 76 may comprise a magnetic material suitable for use within the processing environment such as steel to shunt magnetic fields generated by the magnets of the linear motor used to drive the cantilever stage. A magnetically shielded housing thus prevents the counterbalance mass 72 from being affected by the magnetic field of the linear motor, thereby providing the counterbalance mass 72 and the linear motor 74 with smoother, more predictable movement. Alternatively, the housing 76 may instead be formed of a non-magnetic material, such as aluminum, or a non-conductive material such as ceramic or plastic. Preferably, the housing 76 encloses the counterbalancing mass 72 over its full length of travel.

The mass of the counterbalancing mass 72 combined with the mass of the linear motor 74 used to drive the mass 72 may be selected to be approximately equal to or equal to the mass of the cantilever stage and the armatures of the motors used for driving the cantilever stage. Preferably, the mass of the counterbalance device counterbalancing mass is adjustable in order to account for variances in the mass of the articles supported by the supporting platform. For example, the adjustment of the counterbalancing mass may be achieved either by adding or removing masses from the counterbalancing mass or by replacing a counterbalancing mass with another counterbalancing mass.

The counterbalancing mass 72 may be made of any material suitable for use within the processing equipment, and for economy, the counterbalancing mass may be made of a common metal such as steel or brass. However, non-magnetic materials, such as aluminum, are preferred. The counterbalancing mass 72 may alternatively be formed of a material, such as a ceramic or polymeric material, that does not interact with the magnetic fields generated by the linear motors used to drive the cantilever stage.

The cantilever stage of the present invention may be used with any X-Y positioning stage or system, such as the one disclosed in U.S. Pat. No. 5,700,899, which is incorporated by reference in its entirety herein. Further, the cantilever stage of the present invention may be configured for use in a θ-positioning system by providing a curved bearing track, linear motor, counterbalancing mass, and housing. The cantilever positioning stage of the present invention provides a simple, effective and space-efficient method to control and align articles, such as wafers and/or reticles, to be supported moved and positioned by providing a cantilevered support platform and/or by allowing for the provision of a counterbalance device at the center of gravity of the cantilever positioning stage.

While specific embodiments of the invention have been described and illustrated, it will be appreciated that modifications can be made to these embodiments without departing from the spirit of the invention. Thus, the invention is intended to be defined in terms of the following claims.

What is claimed is:

1. A cantilever stage system, comprising:
   a plate having a first free end portion and a second end portion; and
   a support defining at least one elongate channel extending in a first direction therethrough, said support being connected to said second plate end portion and defining a space including the center of gravity of said plate and said support.

2. The cantilever stage system of claim 1, wherein said space is configured to receive a counterbalance device therein.

3. The cantilever stage system of claim 1, further comprising two linear actuators coupled to said support for moving and positioning said plate and said support along the first direction, wherein the center of gravity of said actuators approximates the center of gravity of said plate and said support.

4. The cantilever stage system of claim 3, further comprising a countermass received in said space.

5. The cantilever stage system of claim 2, wherein said counterbalance device comprises a counter-mass.

6. The cantilever stage system of claim 1, further comprising at least one elongate member each extending through one of said at least one elongate channel, said support being slidable along said elongate member.

7. The cantilever stage system of claim 6, further comprising a linear positioning mechanism connected to said elongate member for moving and positioning said elongate member, plate and support along a second direction, the second direction being generally orthogonal to the first direction.

8. The cantilever stage system of claim 1, wherein said space is generally centrally defined within said support and is at least partially enclosed thereby.

9. A positioning system, comprising a member including a movable portion and a platform extending from said movable portion, said movable portion defining one or more elongate bores extending therethrough in a first direction, said movable portion configured to receive a counterbalance device at a location including the center of gravity of said member.

10. The positioning system of claim 9, further comprising one or more elongate guides each extending through one of said elongate bores such that said movable portion is movable along said guides.

11. The positioning system of claim 9, further comprising at least one linear actuator coupled to said movable portion for moving and positioning said platform and said movable portion along the first direction, wherein the center of gravity of said actuator approximates the center of gravity of said member.

12. The positioning system of claim 9, further comprising the counterbalance device.

13. A cantilever stage system for positioning an article, comprising:
   a movable member defining an open region and two open-ended, elongate and generally parallel bores; and
   a holding plate extending from said movable member, wherein said movable member and said plate has a center of gravity located in said open region.

14. The cantilever system of claim 13, wherein said open region is generally centrally located within said movable member and is at least partially enclosed thereby.

15. A cantilever stage system for positioning an article, comprising:
   a movable member configured to receive two elongate and generally parallel elongate supports therethrough; and
   a holding plate having a first end extending from said movable member and a second free end.

16. The cantilever stage system of claim 15, wherein said movable member defines a volume therearound and wherein said movable member and said holding plate have a center of gravity located in said volume of said movable member.

17. The cantilever stage system of claim 15, further comprising two linear motors attached to said movable member, and wherein the center of gravity of said movable member, said holding plate and said linear motors is approximately the center of gravity of said movable member and said holding plate.

18. The cantilever stage system of claim 15, further comprising a counterbalance device attached to a frame, wherein the center of gravity of said movable member, said holding plate, and said counterbalance device is approximately the center of gravity of said movable member and said holding plate.

19. A method for moving and positioning an article, comprising:

providing a movable member defining an open region and at least one open-ended bore;

providing at least one elongate shaft each extending through one of the at least one bore in a first direction such that the movable member is movable along the shaft;

providing a cantilevered support extending from the movable member such that the center of gravity of the support and movable member is located in the open region;

placing the article on the cantilevered support; and providing an actuator mechanically coupled to the movable member; and actuating the actuator to move the movable member in the first direction along the elongate shaft and to move and position the cantilevered support and the article in the first direction.

20. The method of claim 19, further comprising:

providing a counterbalance device in the open region of the movable member; and actuating the counterbalance device to cancel the forces generated by the movement of the movable member, the cantilevered support and the article.

21. The method of claim 19, further comprising:

providing a second actuator mechanically coupled to the elongate shaft; and actuating the second actuator to move the elongate shaft in a second direction, generally perpendicular to the first direction, and to move and position the cantilevered support and the article in the second direction.

22. A counterbalance device for reducing vibration in a positioning stage, said counterbalance device comprising a counterbalancing mass, at least one bearing on said counterbalancing mass that is capable of supporting at least a portion of the weight of said counterbalancing mass, a housing with which said at least one bearing engages, and a powered actuator attached to said counterbalancing mass to move said counterbalancing mass, wherein said counterbalance device is adapted to fit within an open region of a movable member of a cantilever stage.

* * * * *